United States Patent [19]

Yamada et al.

[11] Patent Number: 5,105,180

[45] Date of Patent: Apr. 14, 1992

[54] COMBINATION LIGHT UNIT AND BATTERY MONITOR DEVICE

[75] Inventors: Masahiro Yamada, N. White Plains, N.Y.; Hideo Yagi, Tokyo, Japan

[73] Assignee: Asahi Research Corporation, Shinagawa, Japan

[21] Appl. No.: 478,548

[22] Filed: Feb. 12, 1990

[51] Int. Cl.$^5$ ............................................. G08B 21/00
[52] U.S. Cl. ..................................... 340/636; 320/48; 324/435; 354/468
[58] Field of Search ................. 340/636, 628; 352/170, 352/171, 172; 324/429, 433, 435; 320/48; 354/418, 465, 468, 473

[56] References Cited

U.S. PATENT DOCUMENTS

| | | | |
|---|---|---|---|
| 4,126,874 | 11/1978 | Suzuki | 320/48 |
| 4,131,351 | 12/1978 | Iwata et al. | 354/468 |
| 4,338,596 | 7/1982 | Huber et al. | 324/433 |
| 4,376,265 | 3/1983 | Kiuchi et al. | 354/468 |
| 4,660,027 | 4/1987 | Davis | 340/636 |
| 4,792,762 | 12/1988 | Shiina et al. | 340/636 |
| 4,906,055 | 3/1990 | Horiuchi | 324/433 |
| 4,982,220 | 1/1991 | Akasaka | 354/468 |

Primary Examiner—Jin F. Ng
Assistant Examiner—Jill Jackson
Attorney, Agent, or Firm—Keck, Mahin & Cate

[57] ABSTRACT

A light unit is combined with circuitry which monitors the charge level of a battery of the light unit or a video camera or camcorder connected to the light unit. With two lights of different wattages, three different constant loads can be applied while observing, in each case, LED indicators each deenergized at a certain voltage level, resulting in an accurate and reliable indication of charge level. The voltage levels are selectable in accordance with the type of battery being monitored and a bridge rectifier allows reversal of battery polarity.

8 Claims, 3 Drawing Sheets

COMBINATION LIGHT UNIT AND BATTERY MONITOR DEVICE

BACKGROUND OF THE INVENTION

1. Field of the Invention

This invention relates to a combination light unit and battery monitor device and more particularly to a device usable with video cameras or camcorders or the like and which is comparatively simple and inexpensive but which is readily operable to obtain reliable indications as to the status of charge of a which is battery used to energize one or more lights and which may also be used for operation of the video camera or camcorder.

2. Background of the Prior Art

The prior art includes a great many disclosures of devices for monitoring the status of charge of various forms of batteries but so far as is known, none of the devices as used or proposed in the prior art have been entirely suitable and satisfactory for reliable monitoring of the condition of charge of batteries such as used in video cameras or camcorders or in light units for use therewith.

SUMMARY OF THE INVENTION

This invention was evolved with the general object of providing a battery monitor device which is highly reliable and readily used while being inexpensively manufacturable.

An important aspect of the invention relates to the recognition that a lamp such as is usable for a battery operated video camera or camcorder provides a load which has a predetermined relatively low resistance and which can be used to load down a battery to obtain a accurate and reliable indication of the condition of charge of a battery and particularly that of a nickel cadmium or "NiCAD" or a battery of similar characteristics. In such a battery, the no-load voltage is substantially constant, and the output voltage under light load conditions decreases only very gradually so that it is not possible to obtain a reliable indication of battery conditions through measurement of battery voltage under light load conditions. However, if a higher load is applied and especially if it is a higher load operative as a resistance of known value, such as is provided by a lamp, it is found to be possible to obtain a highly accurate and reliable indication of the condition of charge of a battery.

In accordance with the invention, a lamp is used to provide a load of known resistance for measurement of the condition of charge of a battery and a comparatively simple and yet highly reliable indicating arrangement is provided, preferably including light-emitting diodes, differential amplifiers and reference voltage sources such as provided by Zener diodes.

A specific feature relates to the indication both of a certain safely discharged condition in which the battery should be recharged and the approach of such condition to alert the user of the impending need for a recharging operation. This feature is realized through the provision of two indicating lights and/or through the use of two selectively operable loads such as provided by two lamps of different wattage ratings. Both can be used to permit the user to accurately measure the charge condition and to avoid the a needless recharge of the battery while at the same time insuring that a recharge will be effected when actually necessary.

Further features relate to the use of a bridge rectifier for operable of the device with batteries of opposite polarity and to the provision of selective means for operation with batteries of different characteristics.

This invention contemplates other objects, features and advantages which will become more fully apparent from the following detailed description taken in conjunction with the accompanying drawings.

DESCRIPTION OF PREFERRED EMBODIMENTS

Figure 1:
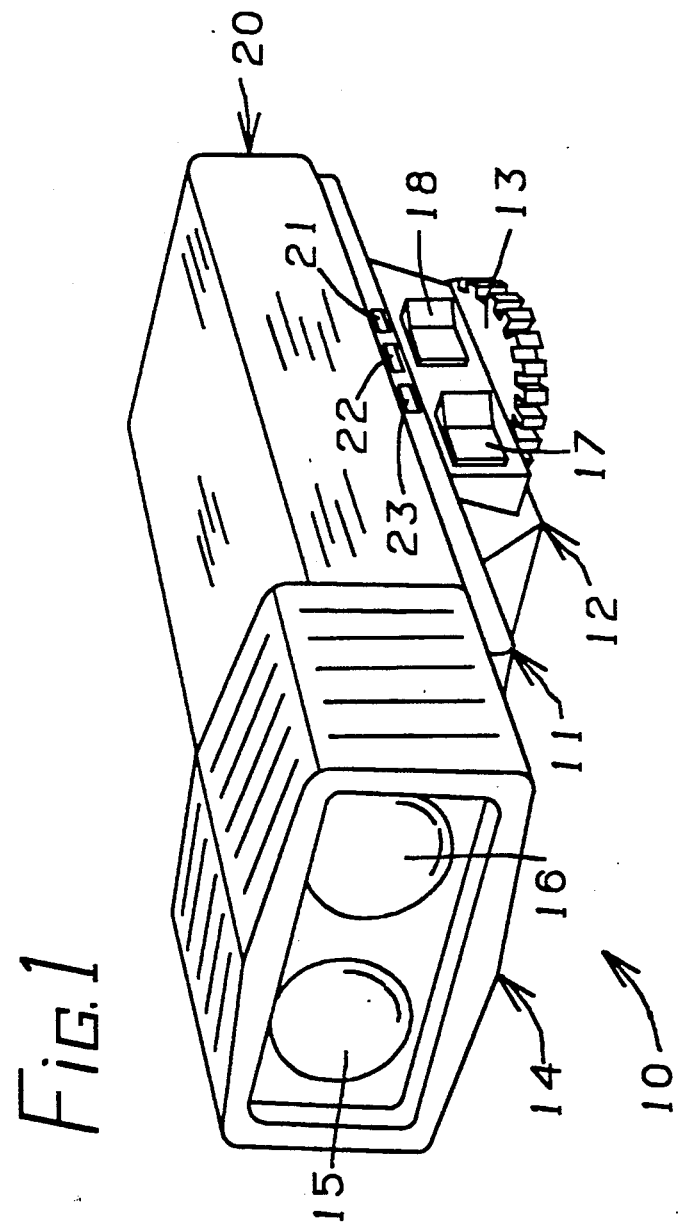
FIG. 1 is a perspective view of a combination light unit and battery monitor device of the invention.

Reference numeral 10 generally designates a combination light unit and battery monitor device which is constructed in accordance with the principles of this invention. The illustrated device 10 includes a base structure 11 having a depending mounting foot 12 for mounting on a video camera or camcorder, using a knurled mounting lock ring 13.

A lamp structure 14 is secured on a forward end of the base structure 11 and includes two lamps 15 and 16. The lamp structure 14 preferably includes a plurality of open slots for ventilation to dissipate the heat generated by the lamps 15 and 16. Lamps 15 and 16 may preferably have different wattages, for example, ten watts and twenty watts, and are controlled by a pair of switches 17 and 18 on the depending mounting foot 12. Three levels of illumination are thus obtained depending upon operation of one or the other of the switches 17 and 18 alone or operation of both together.

The lamps of the device may be energized from a battery of a video camera or camcorder or similar equipment with which the lamps are used and battery monitoring circuitry of the device may be used to monitor the condition of charge of such a battery. However, the base structure 11 of the illustrated device is arranged to releasably receive a battery pack 20 for energization of the lamps and the monitoring circuitry is used to monitor its condition. A release button, not shown, is provided on the rear of the base structure 11 for release of the battery pack 20 so that it can be recharged when necessary.

Three indicating lights 21, 22 and 23 are provided on the side of the base structure 11, above the switches 17 and 18. When the battery is fully charged, and either or both of the switches 17 or 18 is operated, all three indicator lights 21-23 are energized. When the battery is less than fully charged, either or both of the lights 22 and 23 may be deenergized, depending upon the level of charge and depending upon the actuation of the switches 17 and 18.

For example, with switch 18 operated to energize the twenty watt lamp 16, the deenergization of both lamps 22 and 23 may indicate that the level of charge is decreased to a safely discharged condition such that the battery should be recharged. As hereinafter explained in more detail, the indicator lights 21, 22 and 23 may be used in connection with the switches 17 and 18 to determine the approximate level of charge of the battery and to indicate the approach of a safely discharged condition at which the battery should be recharged. This feature is important since it is generally desirable to recharge the battery only after it has been discharged to a substantial extent.

Figure 2:
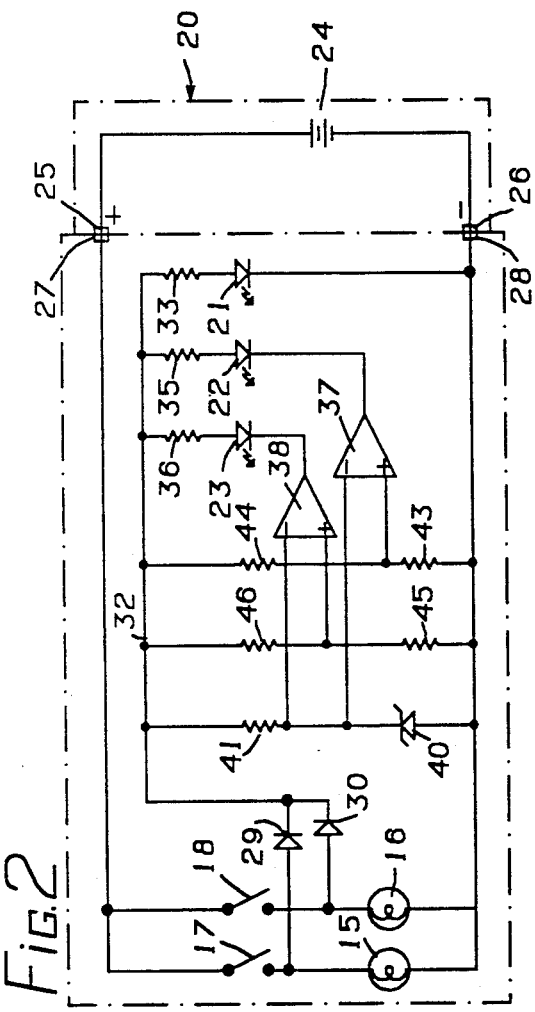
FIG. 2 is a diagram of circuitry of the device of FIG. 1.

FIG. 2 is a diagram of electrical circuitry of the device 10. As shown, a battery 24 of the battery pack 20 is connected to a pair of terminals 25 and 26 which are engaged with terminals 27 and 28 when the battery pack 20 is installed, the terminals 25 and 26 being physically located on the underside of the battery pack while the terminals 27 and 28 may preferably be spring-urged terminals located on the upper side of the base structure 11. For energization of lamps from the battery of a video camera or camcorder, suitable terminals may be provided in a mounting foot of the device, to engage terminals of a mounting shoe which are connectable to the battery of the video camera or camcorder.

As shown, terminal 27 is connected through switches 17 and 18 to terminals of the lamps 15 and 16, the other terminals of lamps 15 and 16 being connected to the terminal 28. The junctions between lamps 15 and 16 and the switches 17 and 18 are connected through diodes 29 and 30 to the conductor 32 so that a positive voltage is developed at conductor 32 relative to the terminal 28 when either of the switches 17 and 18 is closed. Connector 32 is connected through a resistor 33 and the indicator light 21 to the terminal 28, the indicator 28 being preferably a LED, as indicated schematically.

Conductor 32 is also connected through resistors 35 and 36 and through the lights 22 and 23 to outputs of two differential amplifiers 37 and 38. Minus inputs of the amplifiers 37 and 38 are connected to a reference voltage source which is provided by a Zener diode 40 connected in series with a resistor 41 between the terminal 28 and the conductor 32.

The plus input of differential amplifier 37 is connected to a voltage divider formed by resistors 43 and 44 while the plus input of amplifier 38 is connected to a voltage divider formed by resistors 45 and 46, both voltage dividers being connected between terminal 28 and the conductor 32. The values of the resistances of the two voltage dividers in relation to the reference voltage provided by the Zener diode 40 are such as to establish a first voltage level which is less than the no-load voltage of the battery 24 and to establish a second level which is still lower than the no-load voltage of the battery 24.

For example, the no-load voltage may be 6.0 volts, the first level may be 5.7 volts and the third level may be 5.3 volts. When the voltage drops below the first level, the amplifier 37 is switched to deenergize the indicator light 22. When the voltage is below the second level, the amplifier 38 is switched to deenergize the indicator light 23.

Figure 3:
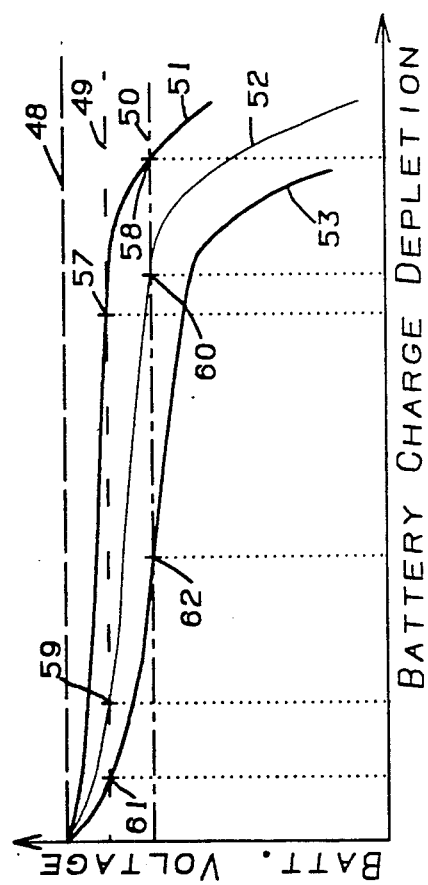
FIG. 3 is a graph illustrating characteristics of a battery of a type which can be monitored, for explanation of the invention.

FIG. 3 is a plot illustrating the type of operation obtained with the illustrated circuit. Dashed line 48 indicates the no-load voltage of the battery which may be six volts, for example. Dashed line 49 indicates the aforementioned first level and broken line 50 indicates the aforementioned second level.

The battery voltage is plotted against battery charge depletion with three different levels of load. In each case the voltage decreases at a relatively gradual rate until the charge reaches the lowest level which is normally safe for effecting a discharge. Beyond that level, the voltage drops precipitously. Curve 51 illustrates the characteristic with a first load applied to the battery which may, for example, be the load provided when only the ten watt lamp 15 is energized. Curve 52 shows the characteristic with a higher load which may, for example, be that with only the twenty watt lamp 16 energized. Curve 53 shows the characteristic with a still higher load such as with both lamps 15 and 16 energized.

The operational characteristics such as depicted in FIG. 3 may be used in a variety of ways for monitoring the condition of charge of the battery 24. For example, using only the ten watt lamp 15, the battery voltage drops below the first level 49 at a point 57, to deenergize the light 22 and drops below the second level 50 at a point 58 to deenergize the light 23. Thus, using only the lamp 15, the deenergization of the light 22 at the point 56 indicates to the user that the battery is less than fully charged and that the conditions are approaching the condition at which the battery should be recharged. Then, when light 23 is deenergized, and with only lamp 15 energized, it indicates to the user that the battery should be recharged.

Similarly, there are two points 59 and 60 on the curve 52 which correspond to points 57 and 58 on curve 51 and two points 61 and 62 on curve 53 which correspond to points 57 and 58 on curve 51. These may be used in a variety of ways. For example, if both indicating lights 22 and 23 are energized when both lamps 15 and 16 are energized, it is indicated that the battery is at least nearly fully charged and that an attempted charging operation is unnecessary. If energization of both lamps 15 and 16 results in deenergization of both indicating lights 22 and 23, it is established that the charge has been depleted beyond a level corresponding to point 62, but if with lamp 16 alone energized, the light 23 remains energized, it is established that the charge has not been depleted beyond a level corresponding to point 60 and that a charge is available for continued operation, especially if the load is light as when only lamp 15 is to be energized.

Figure 4:
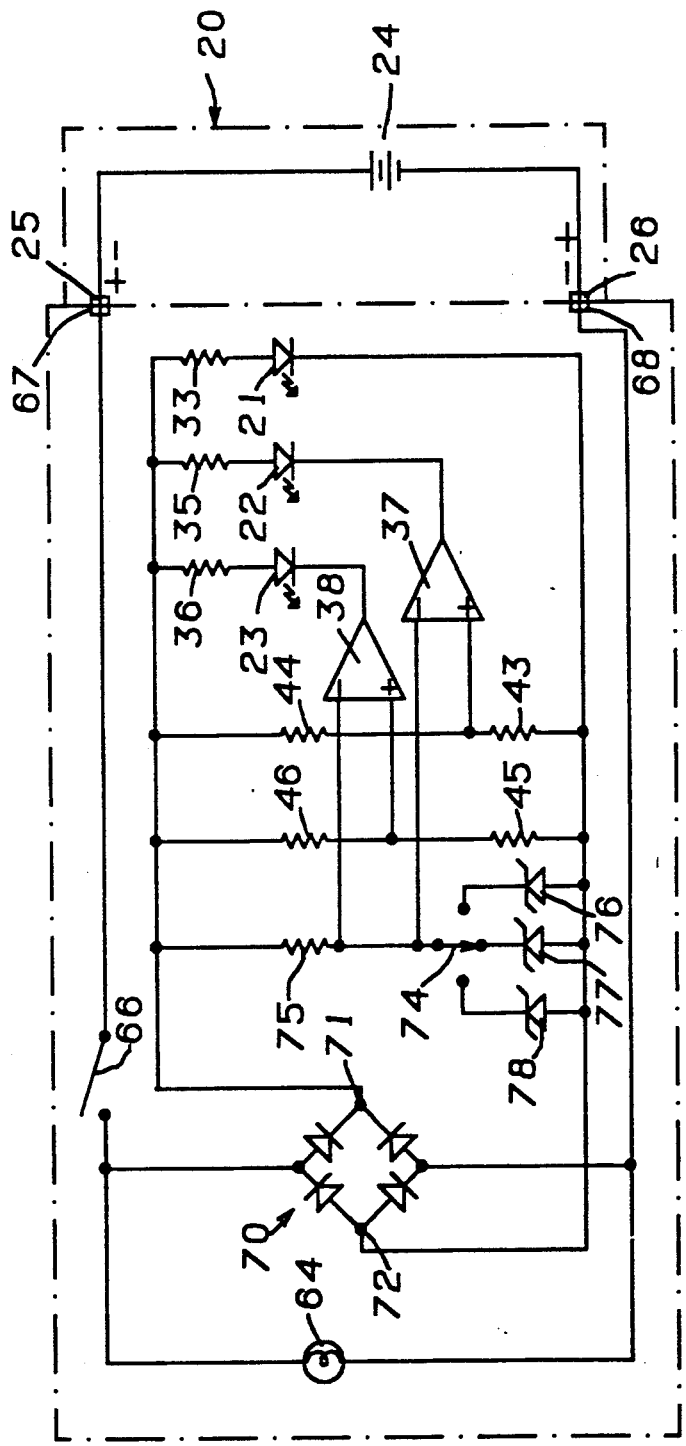
FIG. 4 is a diagram of modified circuitry according to the invention.

FIG. 4 illustrates a modification which uses certain of the same components shown in FIG. 2, but in which only a single lamp 64 is shown connected through a switch 66 to terminals 67 and 68 for connection to the battery terminals 25 and 26 to be energized from the battery 24. The battery 24 in this case may be that of a video camera or camcorder on which the device is mounted and, as indicated by plus and minus signs adjacent terminals 25 and 26, the battery may be of either polarity. The terminals of the lamp 64 are connected to input terminals of a bridge rectifier 70 having positive and negative output terminals 71 and 72 for supplying an operating voltage to indicating circuitry.

The light 21 is connected through a resistor 33 to the positive and negative terminals 71 and 72 and the lights 22 and 23 are connected in circuit with the amplifiers 37 and 38 and associated resistors and voltage dividers in the same manner as shown in FIG. 2. However, the plus input terminals of the amplifiers 37 and 38 are connected to a reference voltage source which is adjustable, a movable contact of a switch 74 being connected through a resistor 75 to the positive output terminal 71 of the bridge rectifier 70, and being selectively connectable through three Zener diodes 76, 77 and 78 to the negative terminal 72 of the bridge rectifier 70.

With the bridge rectifier 70 as shown, the circuitry is usable with batteries of opposite polarity. With the use of the selectable reference voltage levels, the device may be used with different types of batteries. For example, the Zener diode 76 may be used to provide a reference suitable for batteries having a no-load voltage of six volts, such as those used in the Sony, Canon, Sanyo, and other camcorders, the diode 77 may be used to provide a reference suitable for batteries having a no-load voltage of 7.2 volts such as those used in the Hitachi, Minolta and Pentax camcorders and the diode 78 may be used to provide a reference suitable for batteries having a no-load voltage of 9.6 volts, such as used in Panasonic and JVC camcorders.

It will be understood that although only a single lamp 64 is shown in FIG. 4, the features illustrated in this diagram may be used with a device having two or more lamps.

It will be understood that other modifications and variations may be effected without departing from the spirit and scope of the novel concepts of this invention.

What is claimed is:

1. A combination light unit and battery monitor device for use with a video camera or the like and operable by a type of battery having certain no-load output voltage and charge characteristics such that when starting at a fully charged condition and then operating with a load resistance value within a certain range its output voltage is gradually reduced to reach when in a safely discharged condition a certain safe voltage level which is a function of said load resistance value, said device comprising: a pair of input terminal means for interconnection to a pair of terminals of said battery, light means for illumination of objects in a field of view of said camera, connecting means between said light means and said input terminal means for connecting said light means in parallel with said battery for energization therefrom, and battery charge condition indication means connected in parallel relation to said light means for monitoring the battery voltage applied from said battery to said light means, said device having first and second modes of operation, said light means including at least two light means and being arranged to operate in said first mode to provide a low level of illumination and a first predetermined value of load resistance and in said second mode to provide a higher level of illumination and a second predetermined value of load resistance lower that said first predetermined value of load resistance, said battery charge condition indicating means being arranged to operate in said first mode to indicate when the voltage across said light means has dropped below a certain voltage which is equal to said safe voltage level as determined by said first predetermined value of load resistance and in said second mode to again indicate when the voltage across said light means has dropped below a second certain voltage equal to said safe voltage level as determined by said second predetermined value of load resistance, to provide an indication of an approach of said safely discharged condition of said battery.

2. A combination light unit and battery monitor device for use with a video camera or the like and operable by a type of battery having certain no-load output voltage and charge characteristics such that when starting at a fully charged condition and then operating with a load resistance value within a certain range its output voltage is gradually reduced to reach when in a safely discharged condition a safe voltage level which is a function of said load resistance value, said device comprising: a pair of input terminal means for interconnection to a pair of terminals of said battery, light means for illumination of objects in a field of view of said camera and providing a predetermined value of load resistance with there being a certain safe voltage level corresponding to said predetermined value of load resistance, connecting means between said light means and said input terminal means for connecting said light means in parallel with said battery for energization therefrom, and battery charge condition indicating means connected in parallel relation to said light means for monitoring the battery voltage applied from said battery to said light means, said battery charge indicating means including a first indicating light for indicating when said battery voltage has dropped to less than an intermediate voltage which is less than said no-load voltage and higher than said certain safe voltage level, a second indicating light for indicating when said battery voltage has dropped below said certain safe voltage level, and a third indicating light which is energized when said battery voltage is applied to said input terminal means.

3. A combination light unit and battery monitor device for use with a video camera or the like and operable by a type of battery having certain no-load output voltage and charge characteristics such that when starting at a fully charged condition and then operating with a load resistance value within a certain range its output voltage is gradually reduced to reach when in a safely discharged condition a safe voltage level which is a function of said load resistance value, said device comprising: a pair of input terminal means for interconnection to a pair of terminals of said battery, light means for illumination of objects in a field of view of said camera and providing a predetermined value of load resistance with there being a certain safe voltage level corresponding to said predetermined value of load resistance, connecting means between said light means and said input terminal means for connecting said light means in parallel with said battery for energization therefrom, and battery charge condition indicating means connected in parallel relation to said light means for monitoring the battery voltage applied from said battery to said light means, said battery charge indicating means including a first indicating light for provide a first indication when said battery voltage has dropped to less than an intermediate voltage which is less than said no-load voltage and higher than said certain safe voltage level, a second indicating light for providing a second indication when said battery voltage has dropped below said certain safe voltage level, each of said indicating lights being a LED, said battery charge indicating means further including first and second differential amplifiers having output terminals connected to said first and second indicating lights and each having first and second input terminals, reference voltage means coupled to said pair of input terminal means and connected to said first input terminals of both of said differential amplifiers to supply a substantially constant reference voltage thereto, and first and second voltage divider means for controlling the voltage levels at which said first and second indicating lights provide said first and second indications, said first and second voltage divider means being coupled to said input terminal means and being respectively connected to said second input terminals of said first and second differential amplifiers.

4. A combination light unit and battery monitor device for use with a video cameras or the like and selectively operable by first and second types of batteries respectively having first and second substantially different no-load output voltages and respectively having first and second charge characteristics such that when starting at fully charged conditions and then operating with a load resistance value within a certain range the output voltages are gradually reduced to reach when in safely discharged conditions first and second substantially different safe voltage levels each of which is a function of said load resistance value, said device comprising: a pair of input terminal means for selective interconnection to a pair of terminals of each of said first and second types of batteries, light means for illumination of objects in a field of view of said camera, connecting means between said light means and said input terminal means for selectively connecting said light means in parallel with said first and second types of battery for energization therefrom, and battery charge condition indicating means connected in parallel relation to said light means for monitoring the battery voltage applied from said battery to said light means and indicating when the battery voltage drops below a set value, and selection means for selectively setting said battery charge condition indicating means for indicating drops below said set value wherein said set value equals either said first or second safe voltage level according to whether the first or second type of battery is in use.

5. A combination light unit and battery monitor device for use with a video camera or the like and operable by a type of battery having certain no-load output voltage and charge characteristics such that when starting at a fully charged condition and then operating with a load resistance value within a certain range its output voltage is gradually reduced to reach when in a safely discharged condition a certain safe voltage level which is a function of said load resistance value, said device comprising: a pair of input terminal means for interconnection to a pair of terminals of said battery, light means for illumination of objects in a field of view of said camera, connecting means between said light means and said input terminal means for connecting said light means in parallel with said battery for energization therefrom, battery charge condition indicating means, and connection means connecting said battery charge indicating means to said to said light means, said battery charge indicating means including circuitry requiring an operating voltage of one polarity for operation and arranged for indicating wherein the voltage across said light means has dropped below said certain safe voltage level, and said connection means including a bridge rectifier between said circuitry and said light means.

6. A battery monitor device for equipment operable by a type of battery having certain no-load output voltage and charge characteristics such that when starting at a fully charged condition and then operating with a load resistance value within a certain range its output voltage is gradually reduced to reach when in a safely discharged condition a safe voltage level which is a function of said load resistance value, said device comprising: a pair of input terminal means for interconnection to a pair of terminals of said battery, load means for providing a predetermined value of load resistance with there being a certain safe voltage level corresponding to said predetermined value of load resistance, connecting means between said load means and said input terminal means for connecting said load means in parallel with said battery for energization therefrom, and battery charge condition indicating means connected in parallel relation to said load means for monitoring the battery voltage applied from said battery to said load means, said batter charge indicating means including a first indicating light for indicating when said battery voltage has dropped to less than an intermediate voltage which is less than said no-load voltage and higher than said certain safe voltage level, a second indicating light for indicating when said battery voltage has dropped below said certain safe voltage level, and a third indicating light which is energized when said battery voltage is applied to said input terminal means.

7. A battery monitor device for use with equipment selectively operable by first and second types of batteries respectively having first and second substantially different no-load output voltages and respectively having first and second charge characteristics such that when starting at fully charged conditions and then operating with a load resistance value within a certain range the output voltages are gradually reduced to reach when in a safely discharged conditions first and second substantially different safe voltage levels each of which is a function of said load resistance value, said device comprising: a pair of input terminal means for selective interconnection to a pair of terminals of each of said first and second types of batteries, load means, connecting means between said load means and said input terminal means for selectively connecting said load means in parallel with said different types of battery for energization therefrom, and battery charge condition indicating means connected in parallel relation to said load means for monitoring the battery voltage applied from said battery to said load means and indicating when the battery voltage drops below a set value, and selection means for selectively setting said battery charge condition indicating means for indicating drops below said set value wherein said set value equals either said first or second safe voltage level according to whether the first or second type of battery is in use.

8. A battery monitor device for equipment operable by a type of battery having certain no-load output voltage and charge characteristics such that when starting at a fully charged condition and then operating with a load resistance value within a certain range its output voltage is gradually reduced to reach when in a safely discharged condition a certain safe voltage level which is a function of said load resistance value, said device comprising: a pair of input terminal means for interconnection to a pair of terminals of said battery, load means, connecting means between said load means and said input terminal means for connecting said load means in parallel with said battery for energization therefrom, battery charge condition indicating means, and connection means connecting said battery charge indicating means to said to said load means, said battery charge indicating means including circuitry requiring an operating voltage of one polarity for operation and arranged for indicating when the voltage across said load means has dropped below said certain safe voltage level, and said connection means including a bridge rectifier between said circuitry and said load means.

* * * * *